United States Patent [19]

Butler

[11] Patent Number: 4,987,381
[45] Date of Patent: Jan. 22, 1991

[54] TUBE SOUND SOLID-STATE AMPLIFIER

[76] Inventor: Brent K. Butler, 6806 S. Norfolk St., Aurora, Colo. 80016

[21] Appl. No.: 422,738

[22] Filed: Oct. 17, 1989

[51] Int. Cl.$^5$ .............................................. H03F 3/45
[52] U.S. Cl. .................................. 330/255; 330/260; 330/264; 330/300; 381/61
[58] Field of Search ............... 330/255, 260, 264, 269, 330/300; 381/61

[56] References Cited

U.S. PATENT DOCUMENTS 3,984,781 10/1976 Shizuhara .......................... 330/269
4,345,502  8/1982 Jahns ............................. 330/264 X

OTHER PUBLICATIONS

Varenik et al., "Transistorized DC Amplifier for the Spin Stabilization System of an NMR Spectrometer," Instruments & Experimental Technology, vol. 15, No. 4, Jul.-Aug. 1972, pp. 1143-1145.

Primary Examiner—James B. Mullins
Attorney, Agent, or Firm—Harness, Dickey & Pierce

[57] ABSTRACT

A closed loop bipolar transistor driver is coupled to an open loop MOSFET output stage. The closed loop driver amplifier operates within a higher voltage range than the open loop MOSFET output amplifier. The closed loop driver stage is capable of driving the MOSFET output stage into saturation and the MOSFET output stage thereby produces a desirable vacuum tube-like sound characterized by warm, even harmonics. Feedback is used to maintain the closed loop driver circuit in a linear operating regime thereby preventing undesirable hard clipping associated with bipolar transistors when they are overdriven.

4 Claims, 2 Drawing Sheets

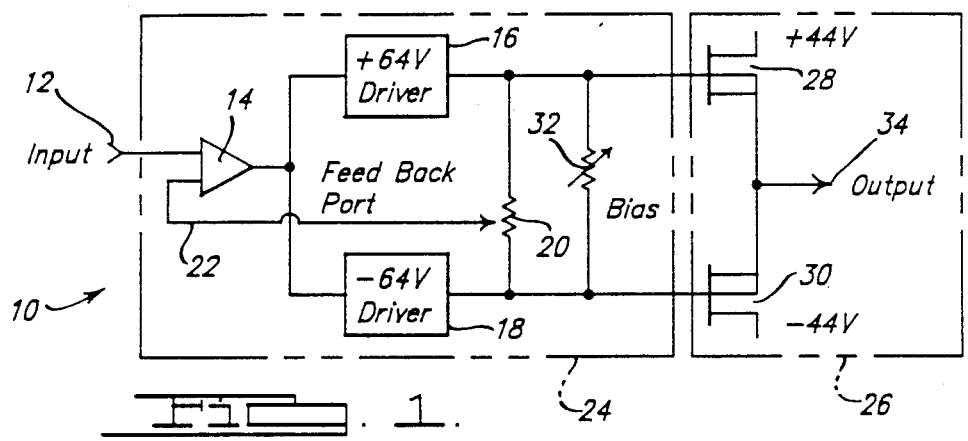
FIG. 1.
Vacuum Tube In Saturation: 
MOS-FET Device In Saturation: 
Bi-polar Transistor In Saturation: 
FIG. 3.
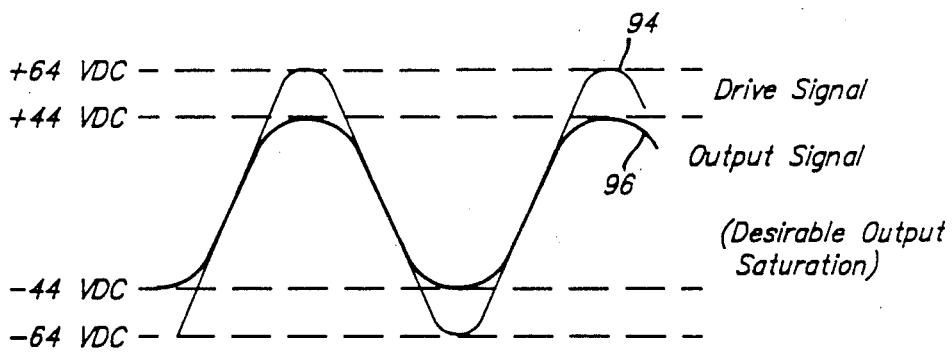
FIG. 4.

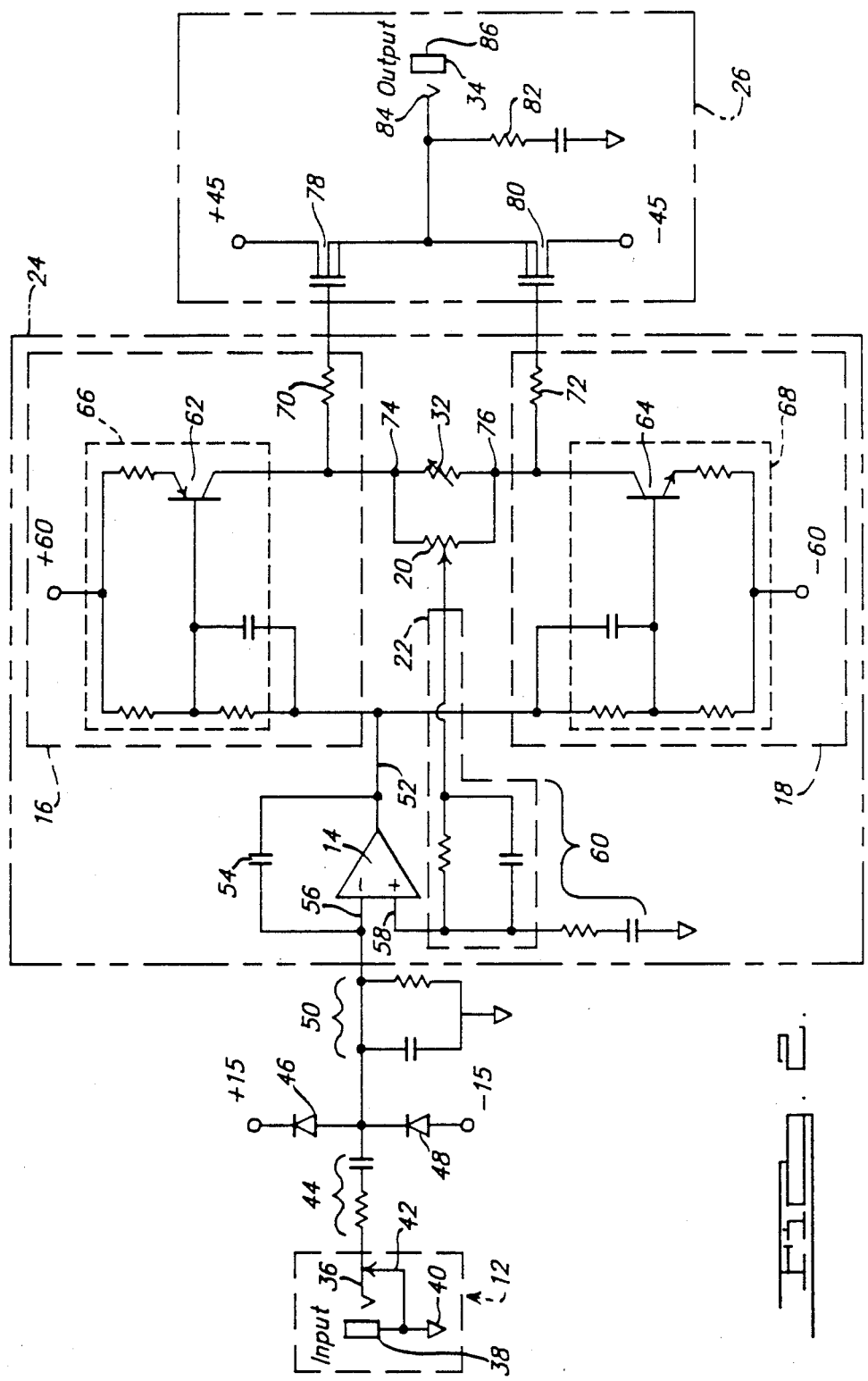

TUBE SOUND SOLID-STATE AMPLIFIER

BACKGROUND AND SUMMARY OF THE INVENTION

The present invention relates generally to musical instrument amplifiers and more particularly to a solid-state amplifier employing a closed loop driver stage and an open loop, even harmonic-rich output stage for providing a tube-like sound desired by many musicians.

Although solid-state amplifiers have become a de facto standard in much of the audio industry, there remains a certain contingent that favors vacuum tube amplifiers. Among those who favor vacuum tube amplifiers are musicians and audiophiles. Vacuum tube amplifiers tend to produce a warm distorted sound characterized by the presence of even harmonics when the amplifier is overdriven. In contrast, conventional bipolar transistor amplifiers tend to have odd harmonic distortion, which is generally considered more harsh or strident than even harmonic distortion. Bipolar transistors, when overdriven, exhibit hard clipping, transforming a sinusoidal input into a sharply defined square wave output. One characteristic of the square wave output is its high frequency content, including considerable power in the odd harmonics. Vacuum tubes, on the other hand, tend to clip in a more rounded manner, somewhat flattening and distorting a sinusoidal input, but without the sharply defined square wave of the bipolar transistor. The vacuum tube amplifier circuit is desired by many because the even harmonic distortion tends to simulate naturally occurring overtones which can be correlated to the musical intervals.

Vacuum tube amplifiers are not without drawbacks, however. First, a conventional vacuum tube circuit requires relatively massive high voltage power supply and vacuum tube circuits tend to generate a lot of unwanted heat. Vacuum tubes also must be replaced from time to time and are more fragile than solid-state amplifiers. Furthermore, due to the wide acceptance of solid-state amplifiers, vacuum tube amplifiers are becoming increasingly costly and obtaining a source of replacement tubes can be a problem for the traveling musician.

There are semiconductor devices which exhibit some tube-like properties, the metal oxide semiconductor field effect transistor (MOSFET) being one of them. MOSFETs generally have a high input impedance and in that regard are similar to vacuum tubes. Although MOSFETs have been used in amplifier circuits in the past, no prior art amplifier has fully exploited the MOSFET device to achieve a tube-like sound.

The present invention exploits the MOSFET device in a hybrid MOSFET/bipolar transistor circuit which provides a desirable tube-like sound in a fully solid state amplifier. When driven into saturation, the amplifier of the invention exhibits a warm tube-like sound characterized by softly clipped or rounded waveforms as contrasted with the sharply defined square wave clipping of a bipolar transistor circuit.

The invention thus provides a device for providing amplification using an electrical signal as an input. The device comprises a closed loop driver stage, such as a bipolar junction transistor amplifier stage, which generates a substantially undistorted signal. In the presently preferred embodiment, the undistorted signal is generated using a differential of the input signal and the output signal of the bipolar junction transistor amplifier, the output signal being comparatively undistorted. The amplifier further comprises an open loop output stage which receives the undistorted signal from the driver stage and generates a distorted output signal rich in even harmonics. The presently preferred embodiment employs a metal oxide semiconductor field effect transistor (MOSFET) amplifier as the output stage.

For a more complete understanding of the invention, its objects and advantages, reference may be had to the following specification, to the accompanying drawings and to the claims.

BRIEF DESCRIPTION OF THE DRAWINGS

FIG. 1 is a block diagram showing the principles of the invention;

FIG. 2 is a detailed schematic diagram illustrating a presently preferred embodiment of the invention;

FIG. 3 is a waveform diagram illustrating the output performance of the invention as compared with vacuum tube and bipolar transistor circuitry;

FIG. 4 is a waveform diagram illustrating the beneficial higher headroom potential of the invention.

DESCRIPTION OF THE PREFERRED EMBODIMENT

With reference now to the drawings, and more particularly to FIG. 1, there is shown a block diagram of tube sound amplifier 10. Input 12 receives an electrical signal frOm any audio source, such as the signal from an electric guitar, which may be preamplified, and is connected to the negative input terminal of operational amplifier 14. Operational amplifier 14 provides the input signal for positive driver 16 and negative driver 18. Positive driver 16 amplifies that portion of the electromagnetic signal received at input 12, that is positive with respect to ground. Similarly, negative driver 18 amplifies that part of the electromagnetic signal which is negative with respect to ground. The output of both drivers is combined at resistor 20 to create a substantially undistorted signal. This undistorted signal is provided to the positive input of operational amplifier 14 via feedback path 22.

As can be seen in FIG. 1 a closed loop amplifier 24 is created by the combination of operational amplifier 14, positive driver 16 and negative driver 18. Operational amplifier 14 provides a differential input for drivers 16 and 18. Operational amplifier 14 takes the differential of substantially undistorted signal 22 and the electromagnetic signal provided at input 12. Drivers 16 and 18 use this differential signal as their input. The drivers 16 and 18 amplify this differential signal, which when amplified is then fed back to operational amplifier 14. Thus, closed loop amplifier 14 is realized by providing a feedback path 22 from the output of drivers 16 and 18 to the input of operational amplifier 14.

Open loop amplifier 26 is realized through the use of two MOSFET devices. Drivers 16 and 18 provide a substantially undistorted output which is delivered, in connection with bias resistor 32, to open loop amplifier 26. This substantially undistorted signal from drivers 16 and 18 can vary in amplitude within a range of +64 to −64 volts. When the substantially undistorted signal has a positive amplitude, positive signal MOSFET 28 becomes active. Similarly, when the substantially undistorted signal has a negative amplitude, negative signal MOSFET 30 is active. The signals generated by positive and negative signal MOSFETs 28 and 30 are combined to provide output 34. The configuration of the two signal MOSFETs realizes an open-loop amplifier 26 because there is no connection between output 34 and the inputs to the two signal MOSFETs.

Referring now to FIG. 2, the electronic circuit of the presently preferred embodiment is illustrated. In the presently preferred embodiment bipolar devices are used for the driver stage and MOSFET devices are used for the output stage. In its broader aspects, the invention can be implemented using other types of electronic amplification devices in other configurations. Accordingly, the invention is not to be limited to only the preferred embodiment described. Input 12 is shown as comprising a tip 36 and a ring or sleeve 38. Ring 38 is connected to circuit ground 40. For convenience, circuit ground is schematically illustrated by an inverted triangle symbol. In the preferred embodiment, input 12 is comprised of a female phone jack in order to accommodate the standard ¼ inch phone jack. Input 12 is constructed in a way such that when a standard guitar cord is inserted into input 12, ground lead 42 will be disconnected from tip 36. However, when a standard guitar cord is removed from input 12 ground lead 42 will become reconnected to tip 36.

Input 12 is connected to voltage limiting diodes 46 and 48 via resistive capacitive network 44. Voltage limiting diodes 46 and 48 constrain the amplitude of the electromagnetic signal received at input 12 to a range of ±15 volts. The electromagnetic signal received at input 12 is then further conditioned by resistive capacitive network 50 before being presented to operational amplifier 14.

Operational amplifier 14 is configured as a comparator, which amplifies the differential of the signal received from feedback path 22 and the signal received from resistive capacitive network 50. Opamp 52 is shown as being connected to positive driver 16 and to negative driver 18. Capacitor 54 provides a high frequency feedback path from opamp output 52 to input 56 of operational amplifier 14. Capacitor 54 provides Operational amplifier 14 with a low pass and inverting configuration. However, the presence of a feedback signal from feedback path 22 presented at opamp input 58 also establishes operational amplifier 14 as a differential amplifier or a Comparator. Feedback path 22 provides a means for conveying the output of the positive driver 16 and the negative driver 18 to opamp input 58. The output of positive and negative drivers 16 and 18 is typically substantially undistorted. This substantially undistorted signal is properly referenced for use by operational amplifier 14 through the use of voltage divider network 60.

Opamp output 52 is conveyed to bipolar junction transistor voltage amplifiers 62 and 64 through voltage division and biasing networks 66 and 68, respectively. Voltage amplifier 62 combined with network 66 and resistor 70 forms positive driver 16. Positive driver 16, as mentioned previously, amplifies that portion of opamp output 52 that is positive with respect to ground. Positive driver 16 amplifies opamp output 52 to a signal with a magnitude varying between 0 and +60 volts. Voltage amplifier 64 combined with network 68 and resistor 72 comprises negative driver 18. Negative driver 18 amplifies that portion of opamp output 52 which is negative with respect to ground. Similarly, negative driver 18 amplifies opamp output 52 to a signal which varies in magnitude 0 and −60 volts. Positive driver output 74 and negative driver output 76 are combined at resistor 20 and bias resistor 32. Thus, resistor 20 provides a signal to feedback path 20 which represents both the positive and negative excursions, with respect to ground, of the amplified signals at positive and negative driver outputs 74 and 76. Both voltage amplifiers 64 and 66 are configured as common emitter invertor amplifiers. As discussed previously, the presence of feedback path 22 from the output of positive and negative drivers 16 and 18 to the input of opamp 14 creates a closed loop amplifier 24. The signal conveyed by feedback path 22 is typically substantially undistorted. This substantially undistorted feedback signal allows for musical amplification which is more desirable by many musicians and audiophiles than the typically distorted feedback signal which is utilized in prior power amplifier designs.

Bias resistor 32 is used to properly offset the gate voltages of MOSFET amplifiers 78 and 80. The signals received by MOSFET amplifiers 78 and 80 are fully sinusoidal, that is, the signals vary through a range of voltages which is both positive and negative with respect to ground. However, MOSFET amplifier 78 is only active when the signal it receives is positive with respect to ground. Similarly, MOSFET amplifier 80 is only active when the signal it receives at its gate is negative with respect to ground. In this configuration MOSFET amplifiers 78 and 80 comprise a push/pull amplifier design. Output 34 is conditioned by resistive capacitive network 82 to provide a proper load impedance balance. MOSFET amplifiers 78 and 80 when combined with resistive capacitive network 82 comprise open loop amplifier 26.

Open loop amplifier 26 is configured for unity gain amplification. Open loop amplifier 26 will follow the output of drivers 16 and 18 through a range of +45 and −45 volts. However, once the output of drivers 16 or 18 exceeds a magnitude of ±45 volts, open loop amplifier 26 will become saturated and will clip the signal that it receives. In this fashion the desirable MOSFET saturation distortion can be achieved at output 34, which is comprised of a tip 84 and a ring or sleeve 86 for use in connecting a loudspeaker or similar load device which utilizes a standard ¼ inch phone jack to the tube sound amplifier 10.

As is illustrated by FIG. 2, the present invention derives particular advantage from its circuit configuration. A pleasing saturation or distortion at output 34, which is desirable for audio amplification uses, is accomplished by providing open loop amplifier 26 with a substantially nondistorted signal for an input. Because this nondistorted signal is also used to generate the feedback signal used as part of the input to closed loop amplifier 24, the undesirable distorted feedback utilized by conventional power amplifier designs is avoided. By substantially eliminating distortion in closed loop amplifier 24 and limiting distortion generally to open loop amplifier 26 a musically pleasing result is achieved. Distortion is achieved in open loop amplifier 26 because closed loop amplifier 24 operates within a range of about ±60 volts to about ±64 volts, whereas open loop amplifier 26 operates only within a range of ±45 volts. In practice, best results are obtained by operating the closed loop amplifier at about ±10 to 25 volts greater than the open loop amplifier although other voltage ranges are also possible. Under these circumstances, closed loop amplifier 24 has more "headroom" than does open loop amplifier 26. Open loop amplifier 26, is therefore driven into distortion or saturation when the magnitude of the output of closed loop amplifier 24 exceeds ±45 volts or the headroom of open loop amplifier 26.

Turning now to FIG. 3, there is illustrated the saturation characteristics of various amplification devices. Tube wave 88 illustrates the output waveform of a vacuum tube that is in saturation while receiving a sinusoidal input. Tube wave 88 is softly clipped and has a rounded form. Similarly, MOSFET wave 90 shows the waveform of a MOSFET device in saturation while receiving a sinusoidal input. MOSFET wave 90 is substantially similar in its clipping characteristics to tube wave 88. MOSFET wave 90 exhibits soft clipping and has a rather rounded form. In contrast, bipolar junction transistor (BJT) wave 92 shows the output waveform of a bipolar junction transistor in saturation while receiving a sinusoidal input. BJT wave 92 exhibits a sharply clipped character which is characterized by a substantially square wave output. BJT wave 92 is characterized by the presence of a substantial amount of signal energy in the odd harmonics of the fundamental frequency. This high frequency energy in the odd harmonics has been found to be undesirable by many musicians. These musicians typically prefer the output characteristics of vacuum tube amplifiers as characterized by tube wave 88. The present invention utilizes an open loop amplifier which is comprised of positive and negative signal MOSFETs 28 and 30 which have an output in saturation which is characterized by MOSFET wave 90. Because MOSFET wave 90 is substantially similar to tube wave 88, the present invention's open loop amplifier 26 has output saturation characteristics that are very similar to the characteristics of vacuum tube amplifiers in saturation, which have previously been found to be desirable by many musicians.

Turning now to FIG. 4, there is illustrated the output waveforms of both closed loop amplifier 24 and open loop amplifier 26. Closed loop amplifier waveform 94 is a drive signal or an input signal for open loop amplifier 26. Closed loop waveform 94 is shown as being substantially undistorted and substantially sinusoidal, and is shown as varying between ±64 volts with respect to ground. As such, closed loop waveform 94 illustrates a situation where all of the headroom of closed loop amplifier 24 is utilized. Closed loop waveform 96 is then provided as a drive signal to open loop amplifier 26, which operates with a unity gain factor. Open loop amplifier waveform 96 is shown as an output signal. Open loop waveform 96 substantially follows closed loop waveform 94 within a range of voltages between ±44 volts with respect to ground. This voltage following characteristic of open loop amplifier 26 is a result of the unity gain characteristics of open loop amplifier 26. However, open loop amplifier 26 cannot follow closed loop waveform 94 for values beyond ±44 volts due to its lower headroom. When closed loop waveform 94 approaches values beyond the supply rails of open loop amplifier 26, i.e., ±45 volts, open loop amplifier 26 enters saturated operation which results in the softly clipped or rounded waveform which characterizes open loop amplifier waveform 96. Open loop waveform 96 is a distorted waveform which represents the output signal that is used by tube sound amplifier 10 to drive loudspeakers or other similar loads. Waveform 96 characterizes a pleasingly distorted audio signal, that does not contain the substantial amount of power in the odd harmonics that many musicians find undesirable.

While the invention has been described in connection with the presently preferred embodiment, the principles of the invention are capable of modification and change without departing from the spirit of the invention as set forth in the following claims.

What is claimed is:

1. An amplifier for simulating vacuum tube sonic characteristics using an electrical signal as an input signal comprising:
   a first amplification stage having an input for receiving said input signal and having an output;
   a means for providing a negative feedback signal path from said output to said input of said first amplification stage;
   a second amplification stage comprising at least one field effect transistor operated in open loop configuration and coupled to said output of said first amplification stage;
   power supply means connected to said first and second amplification stages for supplying a first potential to said first amplification stage and a second potential to said second amplification stage;
   wherein said first potential is of a substantially greater magnitude than said second potential, whereby said second amplification stage may be driven into saturation while said first amplification operates in a substantially linear regime;
   wherein said first stage comprises a differential amplifier having a first input coupled to receive said input signal and having a second input coupled to said feedback signal path and further comprises at least two bipolar transistor devices coupled to said differential amplifier in a push/pull configuration.

2. The amplifier of claim 1 wherein said second amplification stage comprises at least one metal oxide field effect transistor.

3. The amplifier of claim 1 wherein said second amplification stage comprises at least two field effect transistor devices in a push/pull configuration.

4. The amplifier of claim 1 wherein said first potential is at least about ten (10) volts greater in magnitude than said second potential.

* * * * *

UNITED STATES PATENT AND TRADEMARK OFFICE
CERTIFICATE OF CORRECTION

PATENT NO. : 4,987,381

DATED : January 22, 1991

INVENTOR(S) : Brent K. Butler

It is certified that error appears in the above-identified patent and that said Letters Patent is hereby corrected as shown below:

Column 2, line 28, delete "frOm" and insert -- from --.

Column 3, line 52, delete "&2" and insert -- 52 --.

Signed and Sealed this

Eighth Day of September, 1992

Attest:

DOUGLAS B. COMER

*Attesting Officer*     *Acting Commissioner of Patents and Trademarks*